(12) United States Patent
Kobayashi et al.

(10) Patent No.: US 8,142,567 B2
(45) Date of Patent: Mar. 27, 2012

(54) VACUUM PROCESSING APPARATUS

(75) Inventors: Hiroyuki Kobayashi, Kodaira (JP);
Kenji Maeda, Koganei (JP); Masaru Izawa, Hino (JP); Makoto Nawata, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 610 days.

(21) Appl. No.: 12/392,127

(22) Filed: Feb. 25, 2009

(65) Prior Publication Data

US 2010/0192857 A1 Aug. 5, 2010

(30) Foreign Application Priority Data

Jan. 30, 2009 (JP) ................. 2009-019295

(51) Int. Cl.
- *C23C 16/455* (2006.01)
- *C23F 1/00* (2006.01)
- *H01L 21/306* (2006.01)
- *C23C 16/06* (2006.01)
- *C23C 16/22* (2006.01)

(52) U.S. Cl. ............... 118/715; 156/345.26; 156/345.24

(58) Field of Classification Search .................. 118/715; 156/345.26, 345.24
See application file for complete search history.

(56) References Cited

U.S. PATENT DOCUMENTS

| | | | | |
|---|---|---|---|---|
| 5,695,316 A | * | 12/1997 | Schutz et al. | 415/90 |
| 5,788,747 A | * | 8/1998 | Horiuchi et al. | 95/288 |
| 6,382,249 B1 | * | 5/2002 | Kawasaki et al. | 137/565.3 |
| 6,514,348 B2 | * | 2/2003 | Miyamoto | 118/715 |
| 6,835,221 B2 | * | 12/2004 | Rikyuu et al. | 55/315 |
| 6,896,764 B2 | * | 5/2005 | Kitazawa | 156/345.29 |
| 6,910,850 B2 | * | 6/2005 | Nonaka et al. | 415/90 |
| 2001/0052393 A1 | * | 12/2001 | Okabe et al. | 156/345 |
| 2002/0117112 A1 | * | 8/2002 | Okabe et al. | 118/715 |
| 2005/0224179 A1 | * | 10/2005 | Moon et al. | 156/345.29 |
| 2006/0169207 A1 | * | 8/2006 | Kobayashi et al. | 118/715 |
| 2006/0169673 A1 | * | 8/2006 | Okumura et al. | 216/67 |
| 2009/0042321 A1 | * | 2/2009 | Sasaki et al. | 438/10 |
| 2010/0192857 A1 | * | 8/2010 | Kobayashi et al. | 118/723 R |

FOREIGN PATENT DOCUMENTS

| | | |
|---|---|---|
| JP | 04-284840 | 10/1992 |
| JP | 08-014188 | 1/1996 |
| JP | 2006-041088 | 2/2006 |
| JP | 2006-216710 | 8/2006 |
| JP | 2008-240701 | 10/2008 |

* cited by examiner

*Primary Examiner* — Rudy Zervigon

(74) *Attorney, Agent, or Firm* — Antonelli, Terry, Stout & Kraus, LLP.

(57) ABSTRACT

A vacuum processing apparatus includes a member having a gas passage formed in a center between the pressure adjusting valve of an exhaust system and a turbo-molecular pump, and a particle dispersion prevention unit having plural stationary blades formed to be tilted in a direction opposite the direction of the rotary blade of the turbo-molecular pump on the outer circumference of the member.

10 Claims, 12 Drawing Sheets

(COMPARATIVE EXAMPLE)

(COMPARATIVE EXAMPLE)

(COMPARATIVE EXAMPLE)

(COMPARATIVE EXAMPLE)

VACUUM PROCESSING APPARATUS

CLAIM OF PRIORITY

The present application claims priority from Japanese Patent Application JP 2009-019295 filed on Jan. 30, 2009, the content of which is hereby incorporated by reference into this application.

FIELD OF THE INVENTION

The present invention relates to a vacuum processing apparatus, and more particularly, to a vacuum processing apparatus with a particle dispersion prevention function to prevent the particle reflected by a turbo-molecular pump from dispersing into a vacuum processing chamber.

BACKGROUND OF THE INVENTION

Generally, a plasma etching process and a plasma CVD process have been widely employed in a manufacturing steps of a semiconductor device such as a DRAM and a microprocessor. The number of particles adhered to a sample to be processed such as a wafer is required to be reduced as one of problems to be solved in processing of the semiconductor device using plasma. For example, when the particle drops on the fine pattern of the sample to be processed during the etching or prior to the processing, etching to the dropped part is partially inhibited, thus causing the defect on the fine pattern of the sample to be processed such as disconnection, resulting in reduced yielding. In the turbo-molecular pump, the blades rotate at the rotating speed of 300 m/s, for example, to scatter the particle is considered as one of the factors to cause the particle dispersion into the vacuum chamber. Meanwhile, the particle flows into the turbo-molecular pump at several m/s as the flow rate of gas. As the particles apparently drop at the considerably low speeds with respect to the rotation blade, most of the particles fail to pass through the rotation blades, and impinge against the leading end of the rotary blade and are reflected at the high speed to be dispersed into the chamber.

Japanese Patent Application Laid-Open Publication No. H8-14188 discloses that the stationary blade for preventing reflection of the foreign substance is disposed at one stage upper position with respect to the rotary blade. Japanese Patent Application Laid-Open Publication No. 4-284840 discloses that the baffle plate (plate for reflecting foreign substance) is disposed above the turbo-molecular pump. Japanese Patent Application Laid-Open Publication No. 2008-240701 discloses that plural baffle plates are disposed above the turbo-molecular pump. Japanese Patent Application Laid-Open Publication No. 2006-216710 discloses that the baffle plate is disposed on the side surface of the sample stage on which the sample to be processed is placed inside the vacuum processing chamber so as to prevent the dispersed particle from reaching the space for processing the sample.

Meanwhile, Japanese Patent Application Laid-Open Publication No. 2006-41088 discloses the processing gas supply system for supplying the processing gas into the vacuum processing chamber in detail.

SUMMARY OF THE INVENTION

The plasma processing apparatus is mostly used for the process having the pressure inside the vacuum processing chamber set to several Pascal or lower while supplying the processing gas at the flow rate of several hundreds ml/min into the vacuum processing chamber. The exhaust conductance values of the vacuum processing chamber and the evacuation system have to be large enough to conform to the low pressure processing. The baffle plate for preventing dispersion of the particle in the vacuum processing chamber has the disadvantage of lowering the exhaust conductance. The use of the baffle plate requires some device to suppress decrease in the discharge speed.

It is an object of the present invention to provide a vacuum processing apparatus which reduces the number of particles adhered to the sample to be processed while suppressing decrease in the exhaust speed as low as possible.

The present invention provides a vacuum processing apparatus having a vacuum processing chamber, a gas supply unit for supplying processing gas to the vacuum processing chamber, and a turbo-molecular pump for reducing pressure of the vacuum processing chamber. The apparatus includes a particle dispersion prevention unit disposed between the turbo-molecular pump and the vacuum processing chamber. The particle dispersion prevention unit includes a blade support ring, a plurality of blades provided on an outer circumference of the blade support ring, and an annular space formed downstream of the plural blades. A tilting direction of the blade of the particle dispersion prevention unit is opposite a tilting direction of a rotary blade of the turbo-molecular pump, and a gap between the blades forms a first exhaust route. The blade support ring includes a hole formed in a center, which forms a second exhaust route as a gas passage. The annular space transfers the gas passing through the second exhaust route in a radial direction so as to be mixed with the gas passing through the first exhaust route to form a third exhaust route for guiding the mixed gas to the rotary blade of the turbo-molecular pump.

According to the present invention, the gas passage is formed in the center of the particle dispersion prevention unit to suppress dispersion of the particle scattered by the turbo-molecular pump into the sample processing space in the vacuum processing chamber while preventing decrease in the exhaust speed.

DETAILED DESCRIPTION OF THE PREFERRED EMBODIMENTS

Figure 1:
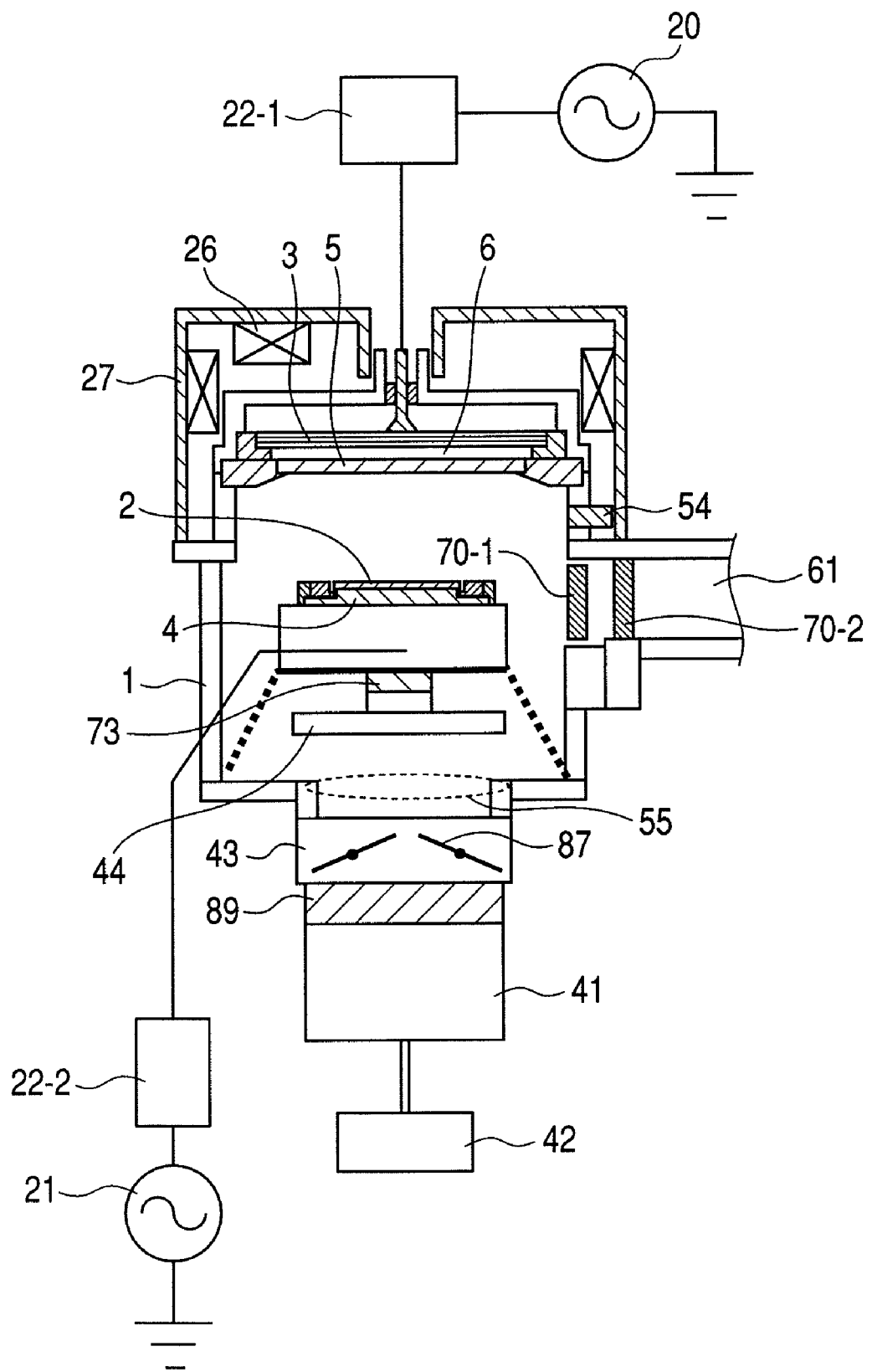
FIG. 1 is a longitudinal sectional view schematically showing an entire structure of a plasma processing apparatus which employs a vacuum processing chamber according to the present invention.

According to the present invention, a typical apparatus for manufacturing a semiconductor includes a vacuum processing chamber for processing a sample to be processed, a gas supply unit for supplying gas to the vacuum processing chamber, a stage for mounting the sample to be processed, a turbo-molecular pump for reducing the pressure in the vacuum processing chamber, and a pressure adjusting valve (for example, butterfly valve) disposed between the turbo-molecular pump and the vacuum processing chamber for adjusting the pressure of the vacuum processor chamber.

The apparatus is provided with a support member having a passage at the center in a space between the pressure adjusting valve and the turbo-molecular pump, and a particle dispersion prevention unit formed by disposing plural stationary blades each tilting opposite the direction of the rotary blade of the turbo-molecular pump on the outer circumference of the support member.

Embodiments of the vacuum processing apparatus according to the present invention will be described with respect to a plasma processing apparatus referring to the drawings.

First Embodiment

A vacuum processing chamber of a plasma processing apparatus to which the present invention is applied will be briefly described referring to FIG. 1. An antenna 3 for supplying high frequency power for generating plasma is disposed above a vacuum processing chamber 1. The antenna is connected to a high frequency power source (source power supply) 20 for generating the plasma via a matching box 22-1. The antenna is provided with a gas distribution plate 6 for distributing the processing gas in the radial direction, and a shower plate 5 with plural gas holes formed for introducing the processing gas into the vacuum processing chamber 1. The processing gas is supplied from the processing gas supply system (not shown) so as to be introduced into the gas distribution plate 6. The processing gas supply system disclosed in Japanese Patent Application Laid-Open Publication No. 2006-41088 may be employed. The vacuum processing chamber 1 is provided with a sample stage 4 on which a sample 2 to be processed is placed, and a vertical drive mechanism 73 for driving the sample stage 4. The sample stage is connected to a bias power source 21 for applying the bias power via a matching box 22-2 for the purpose of accelerating the incident ion to the sample to be processed.

A turbo-molecular pump 41 is disposed below an exhaust port 55 of the vacuum processing chamber 1 as the exhaust unit for reducing the pressure of the vacuum processing chamber. An exhaust system is constituted including the turbo-molecular pump 41, a dry pump 42 and a butterfly valve (pressure adjusting valve) 43. The butterfly valve 43 is disposed upstream of the turbo-molecular pump 41 for controlling the pressure within the vacuum processing chamber. The dry pump 42 is provided downstream of the turbo-molecular pump 41. A main valve 44 is disposed in the vacuum processing chamber 1 just above an exhaust port 55 for shielding the vacuum processing chamber 1 from the exhaust system. A particle dispersion prevention unit (to be described in detail) 89 is interposed between the turbo-molecular pump 41 and the butterfly valve 43 in the exhaust system for suppressing dispersion of the particle scattered by the turbo-molecular pump in the vacuum processing chamber 1 via the exhaust system. The vacuum processing chamber 1 is provided with a vacuum meter 54 for measuring the inner pressure of the processing chamber. The vacuum processing chamber 1 is connected to a vacuum transfer chamber 61 (not shown) via two gate valves 70-1 and 70-2.

Figure 2A:
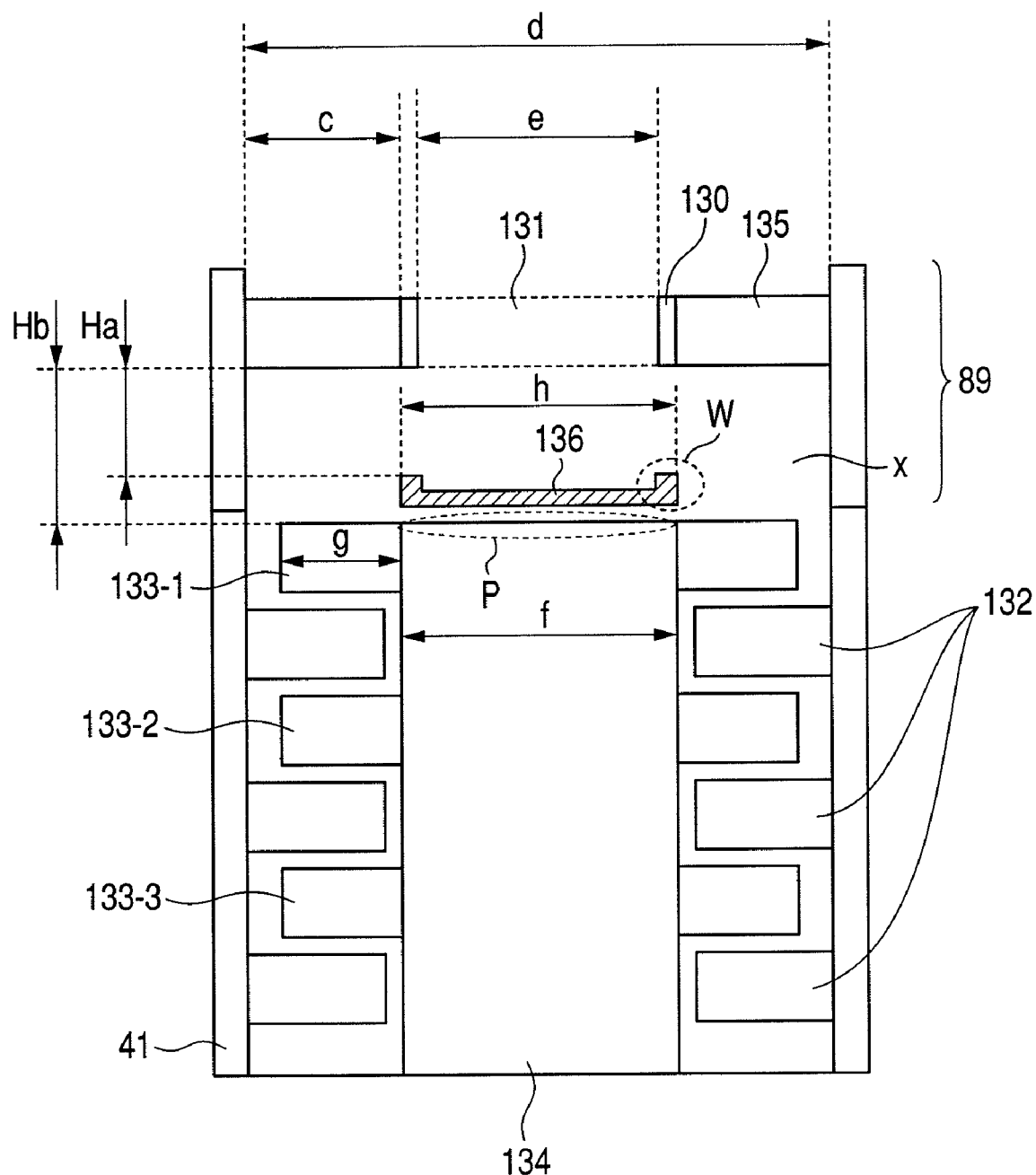
FIG. 2A is an enlarged view schematically showing an area around a turbo-molecular pump and a particle dispersion prevention unit in the vacuum processing chamber as a first embodiment according to the present invention.
Figure 2B:
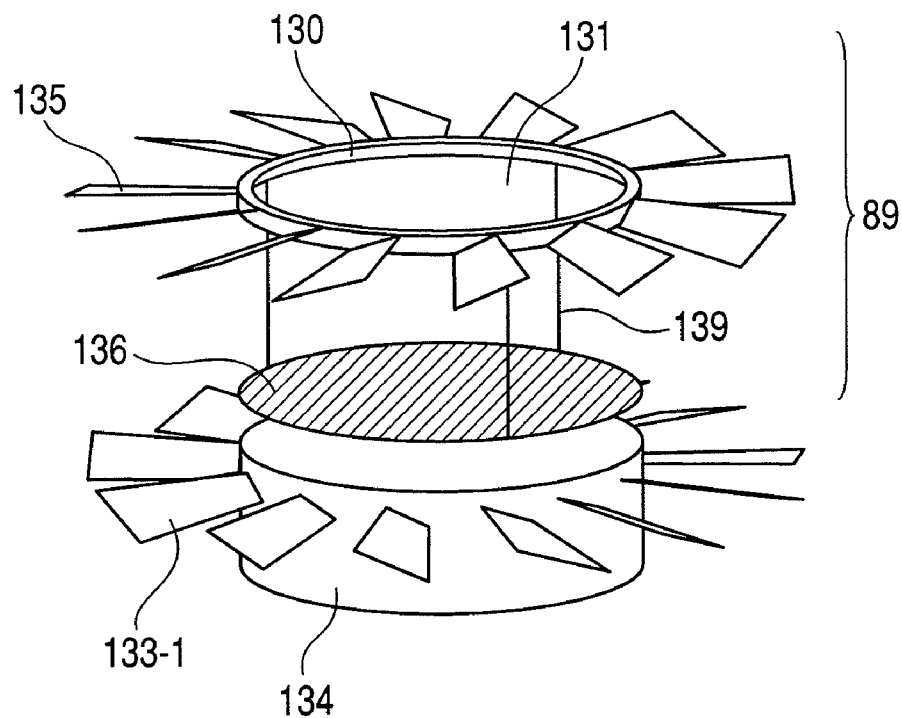
FIG. 2B is a perspective view three-dimensionally showing the particle dispersion prevention unit and a rotary blade of the turbo-molecular pump according to the first embodiment.
Figure 2C:
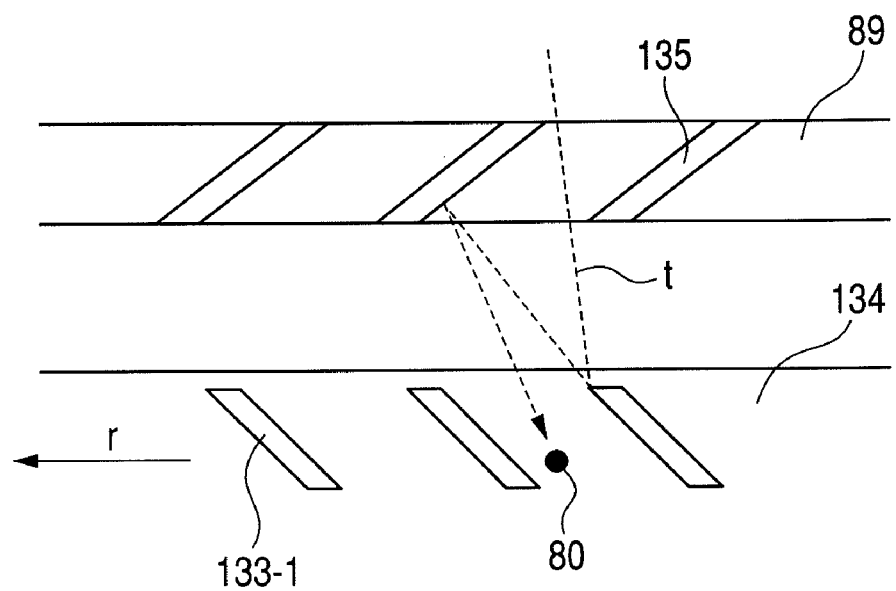
FIG. 2C is a view showing each tilting direction of the rotary blade of the turbo-molecular pump and the blade of the particle dispersion prevention unit.

The particle dispersion prevention unit 89 according to the embodiment will be described referring to FIGS. 2A to 2C. FIG. 2A is a sectional view schematically showing the area around the turbo-molecular pump 41 and the particle dispersion prevention unit 89. FIG. 2B is a schematic view three-dimensionally showing the particle dispersion prevention unit 89 and the rotary blade of the turbo-molecular pump. FIG. 2C is an explanatory view showing each tilting direction of the rotary blade 133 of the turbo-molecular pump and a blade 135 of the particle dispersion prevention unit.

The particle dispersion prevention unit 89 is formed by attaching plural particle reflection plates (stationary blade) 135 around the outer circumference of an annular blade support ring 130 having the center hole. That is, in the present invention, a gas passage 131 with the diameter e is formed in the center of the particle dispersion prevention unit to suppress decrease in the exhaust conductance.

The stationary blade 135 of the particle dispersion prevention unit tilts in the direction opposite the direction of the rotary blade 133-1 at the uppermost stage of the turbo-molecular pump. Referring to FIG. 2C showing the trace t of the particle 80, when the particle scattered by the rotary blade 133-1 which rotates in the direction r impinges against the stationary blade 135 of the particle dispersion prevention unit, it will be repelled downward. The number of the stationary blades 135, the size and the interval between adjacent blades do not have to be equivalent to those of the rotary blade 133-1. They may be determined in accordance with the balance between the required exhaust conductance and the effect for reducing the number of particles.

A particle drop prevention tray 136 is provided just above the rotary shaft 134 of the turbo-molecular pump at the lower portion of the particle dispersion prevention unit 89. The particle drop prevention tray 136 is fixed to the blade support ring 130 with support members 139 (See FIG. 2B).

As shown in FIG. 2A, the particle dispersion prevention unit 89 includes a space x with a height Ha for guiding the gas passing through the gas passage 131 to the outer circumferential direction. A height Hb denotes the distance from the upper end of the rotary shaft 134 of the turbo-molecular pump to the stationary blade 135 of the particle dispersion prevention unit 89.

The structures of the particle dispersion prevention unit and the turbo-molecular pump, that is, the distance relationship therebetween will be described in detail referring to FIGS. 3A to 3D.

Figure 3A:
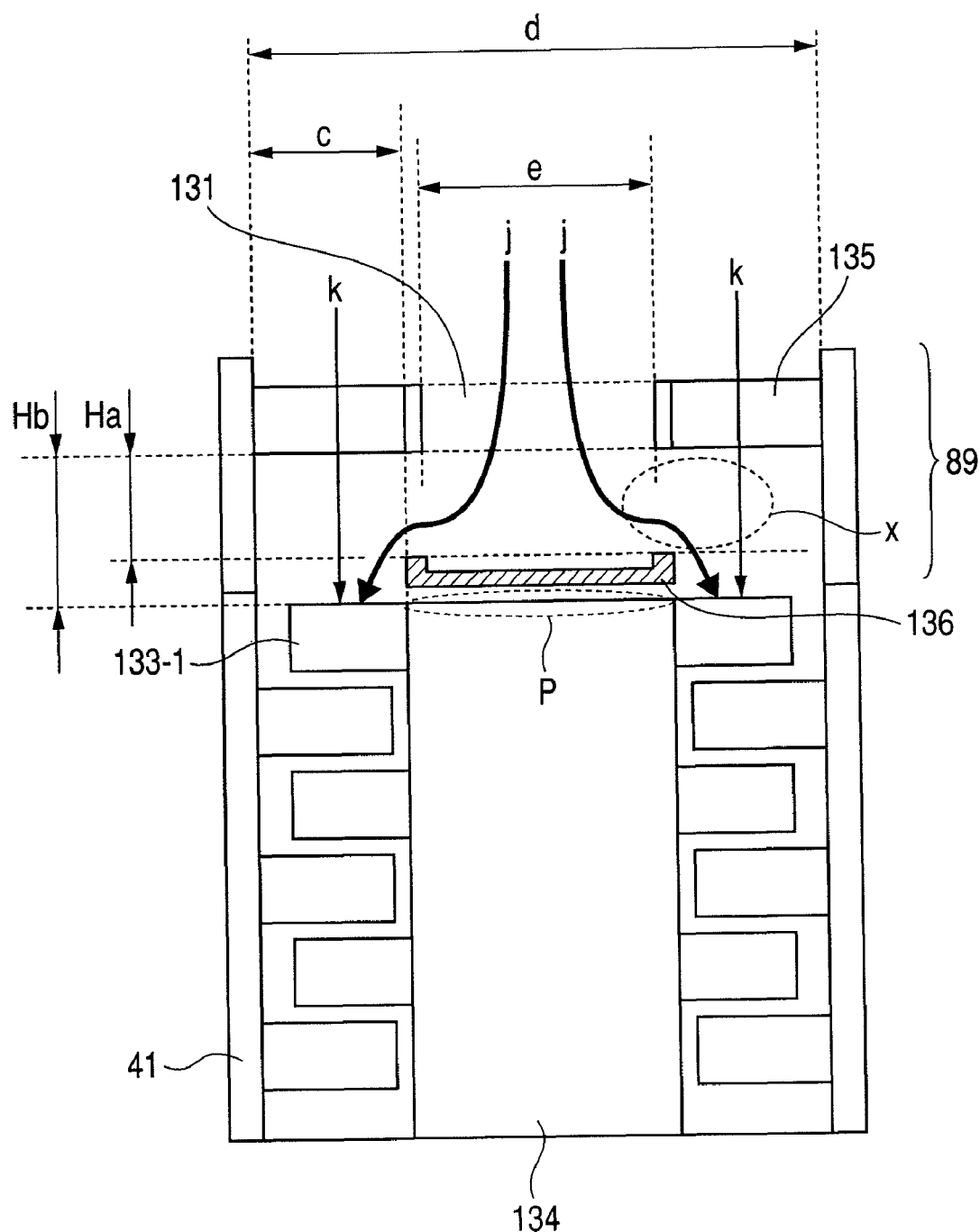
FIG. 3A is a view showing the function and effect derived from the first embodiment of the present invention.

FIG. 3A corresponding to FIG. 2A shows a structure of the particle dispersion prevention unit 89 according to the present invention. In the present invention, the gas passage 131 with the diameter e is formed in the center of the particle dispersion prevention unit to suppress decrease in the exhaust conductance. In other words, the gas supplied into the vacuum processing chamber is exhausted by the turbo-molecular pump via first exhaust routes (designated with k in FIG. 3A) which pass through the gap between a plurality of blades 135 of the particle dispersion prevention unit, two second exhaust routes (designated with j in FIG. 3A) which pass through the center gas passage 131, and a third exhaust route (designated with k+j in the space x shown in FIG. 3A) which passes the annular space (designated with x shown in FIG. 3A) for guiding the mixed gas at the first and the second exhaust routes to the area around the rotary blade 133-1 at the uppermost stage of the turbo-molecular pump.

The annular space x, that is, the third exhaust route between the rotary blade 133-1 at the uppermost stage of the turbo-molecular pump and the particle drop prevention tray 136, and the stationary blade 135 of the particle dispersion prevention unit for guiding the gas passing through the gas passage 131 to the outer circumferential dimension is required to have a predetermined height Ha for making the emission of the second exhaust route j sufficiently large.

Figure 3B:
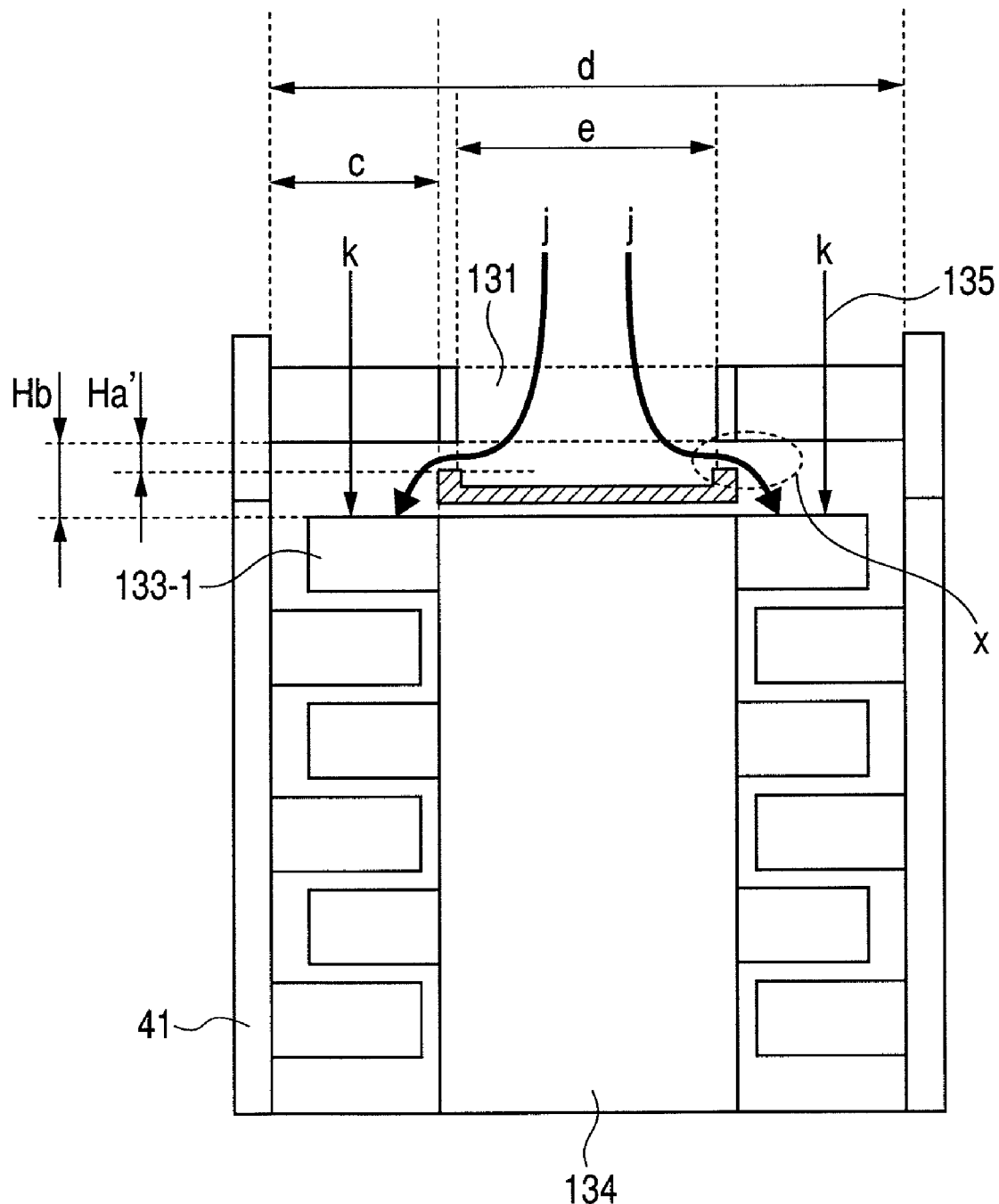
FIG. 3B is a view showing the function and effect derived from a comparative example having the height Ha' of a space x shorter than that of the present invention.

FIG. 3B shows a comparative example having the space x with the shorter height Ha'. If the height Ha' is too short, the passage for transferring the inflow gas via the center gas passage to the rotary blade of the turbo-molecular pump via the third exhaust route becomes narrow. In other words, the flow rate (designated with j shown in FIG. 3B) of the gas to be discharged via the second exhaust route becomes low, and accordingly, the first exhaust route which passes the gap between a plurality of blades 135 of the particle dispersion prevention unit (designated with k shown in FIG. 3B) becomes the main exhaust route. The exhaust conductance of the gas per unit area of the first exhaust route when seen from above is smaller. In the case as shown in FIG. 3B, the disadvantage as largely reduced exhaust conductance is observed compared with the case shown in FIG. 3A.

FIG. 4 of Japanese Patent Application Laid-Open Publication No. 2006-216710 shows the structure provided with the blades (as slit 14) serving to prevent the particle dispersion on the side surface of the sample stage for the sample to be processed. In this case, the gas supplied from the upper surface of the vacuum processing chamber is substantially discharged only through the route which passes through the gap between the blades for preventing the particle dispersion. The gap between the adjacent slits 14 has to be reduced for the purpose of preventing the particle repelled by the turbo-molecular pump from reaching the processing space (space above the sample to be processed) where the processing of the sample is performed. On the contrary, this may reduce the exhaust conductance.

The similar problem occurs in the structure shown in FIG. 3B as well.

In order to reduce the number of particles adhered to the sample to be processed while maintaining sufficient exhaust conductance, the height Ha of the region x has to be sufficiently long. Preferably the height Ha of the space x (third exhaust route) for mixing the gas passing through the center gas passage (second exhaust route) transferred in the radial direction with the gas passing through the gap between a plurality of blades 135 (first exhaust route) is set such that the exhaust conductance of the second exhaust route is increased by establishing the relationship of $$Ha \geq 0.1 \times g,$$

where g denotes the radial length of the rotary blade 133-1 of the turbo-molecular pump. When the particle drop prevention tray 136 is not used, or its thickness is negligible, the relationship of Ha=Hb may be established, that is, the height Ha denotes the distance from the upper end of the rotary shaft 134 of the turbo-molecular pump to the stationary blade 135.

Figure 3C:
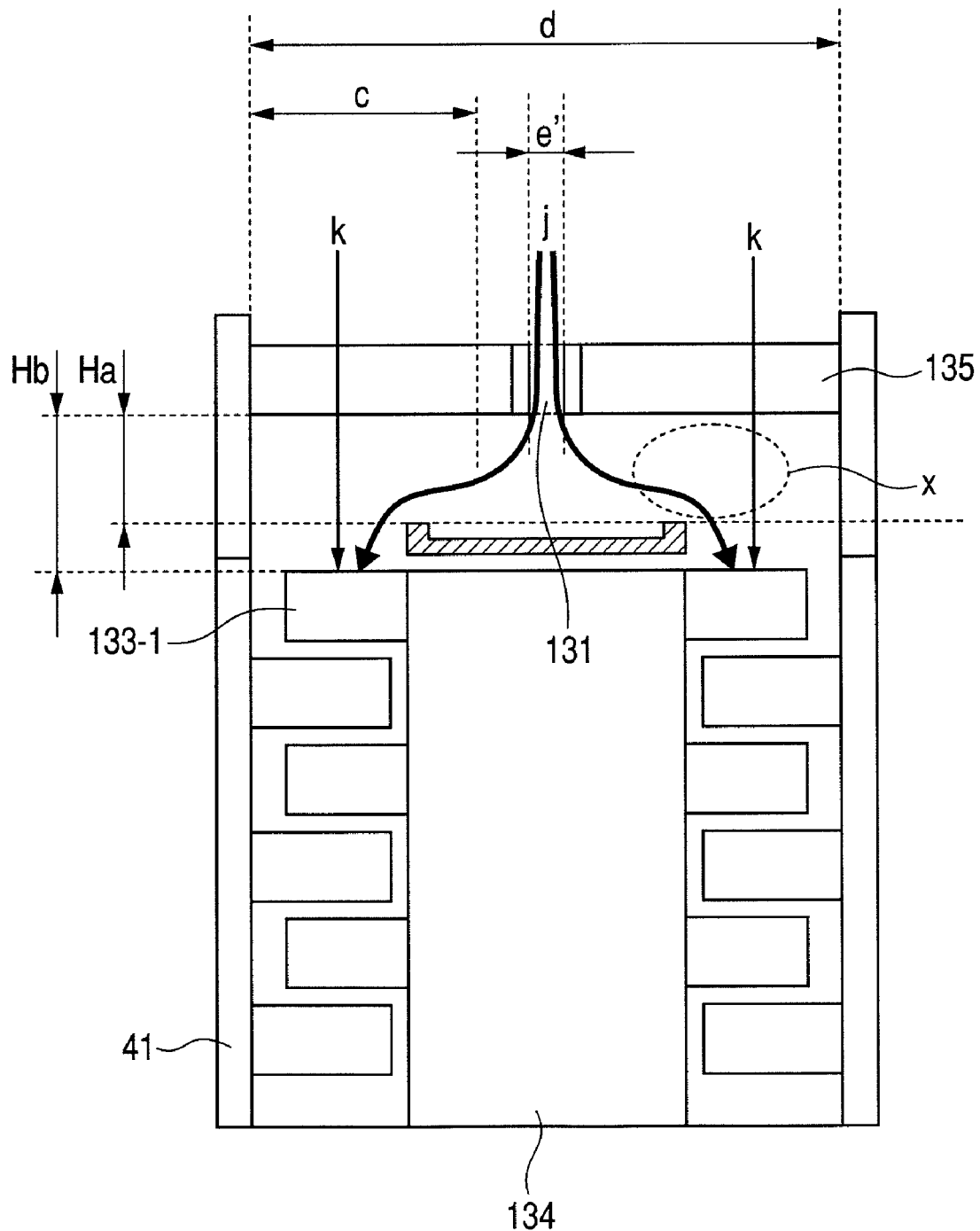
FIG. 3C is a view showing the function derived from a comparative example having the diameter e' of a center gas passage excessively smaller than that of the present invention.

The gas passage 131 formed in the center of the particle dispersion prevention unit will be described. FIG. 3C shows the comparative example having the second exhaust route, that is, the center gas passage 131 having the diameter e' smaller compared with the structure shown in FIG. 3A.

In this case, although the x region has sufficient space, the flow rate of the gas discharged via the second exhaust routes (j shown in FIG. 3C) which pass the center gas passage becomes low. In other words, the first exhaust routes k which pass the gap between the stationary blades 135 of the particle dispersion prevention unit becomes the main exhaust route, resulting in the decreased exhaust conductance.

It is preferable to establish the relationship of $$e \geq 0.25 \times d$$

where d denotes the inner diameter (diameter of the inner wall of the particle dispersion prevention unit) of the turbo-molecular pump.

Figure 4A:
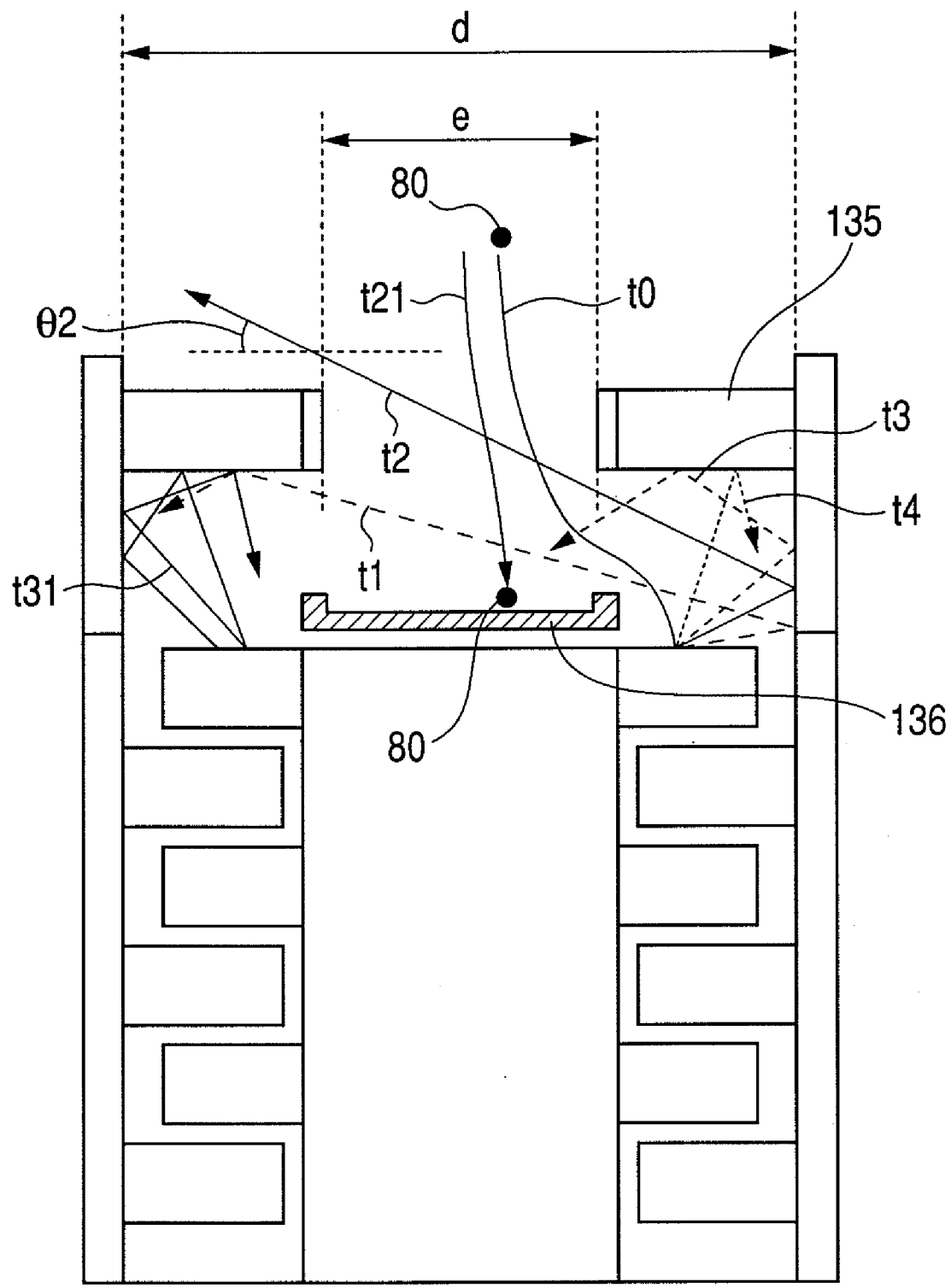
FIG. 4A shows the function and effect of a particle drop prevention tray according to the first embodiment, and trajectories of the particle seen from the side.
Figure 4B:
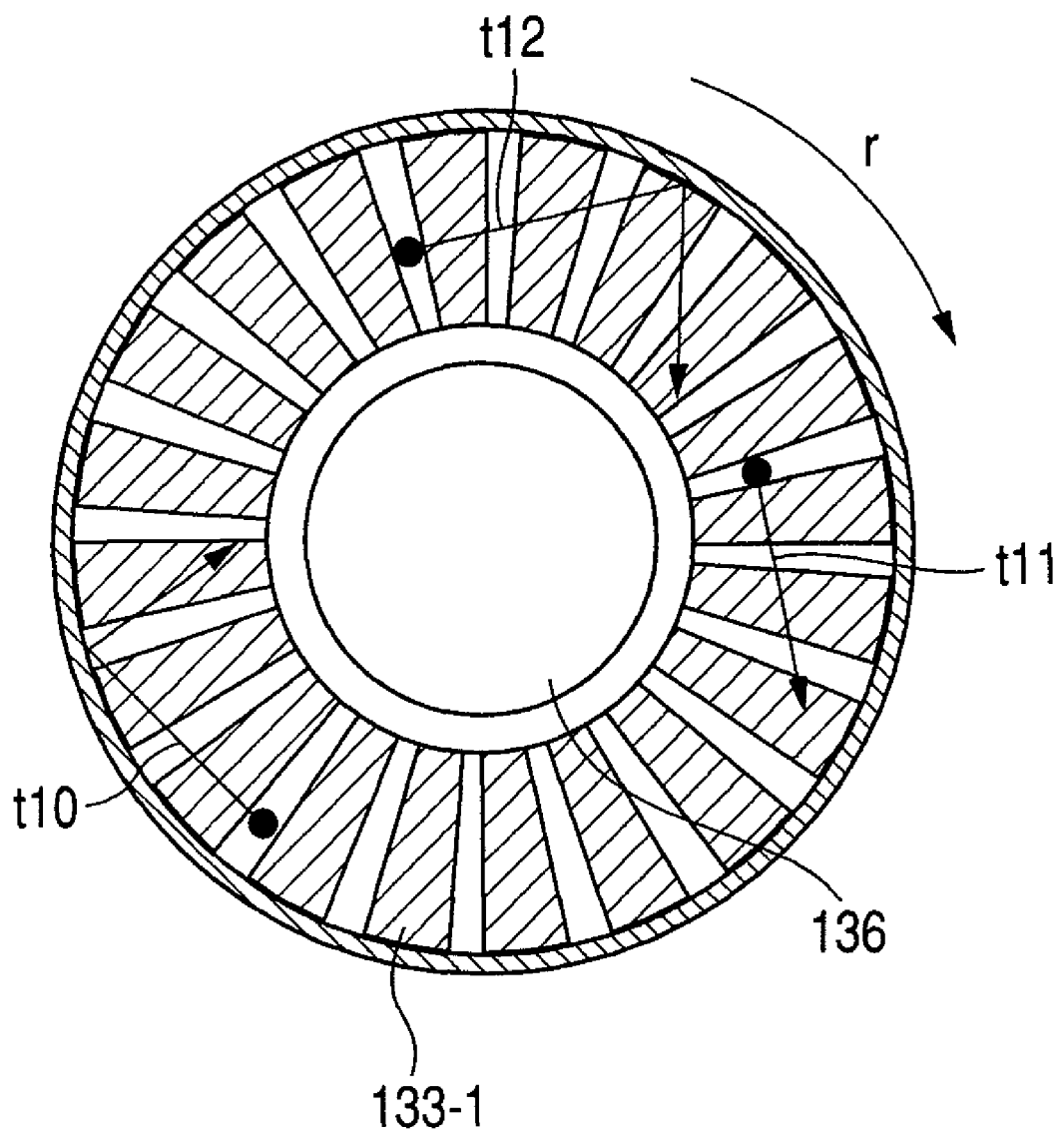
FIG. 4B shows the function and effect of the particle drop prevention tray according to the first embodiment, and tracks of the particle seen from above.

The upper limit of the diameter e of the second exhaust route, that is, the center gas passage 131 will be described. FIGS. 4A and 4B briefly show exemplary traces of the particle which has been scattered by the turbo-molecular pump. FIGS. 4A and 4B show the traces of the particle seen from the side and above, respectively. As the traces t10 to t12 of the particle in FIG. 4B show, the particle is repelled at high speeds by the rotary blade 133-1 of the turbo-molecular pump in the rotating direction r of the rotary blade, and in the direction substantially tangent to the rotation r. The repelled particle first impinges against the side wall (see traces t1 to t3, t31 in FIG. 4A) or impinges against the stationary blade 135 of the particle dispersion prevention unit (t4). Even if the gas passage 131 is formed in the center of the stationary blade 135, it is unlikely that the particle repelled by the rotary blade 133-1 passes through the gas passage 131 to be dispersed into the vacuum processing chamber without being in contact with some portion. This indicates that the effect for preventing dispersion of the particle is hardly deteriorated even if the center gas passage of the particle dispersion prevention unit is made large to a certain degree.

Figure 3D:
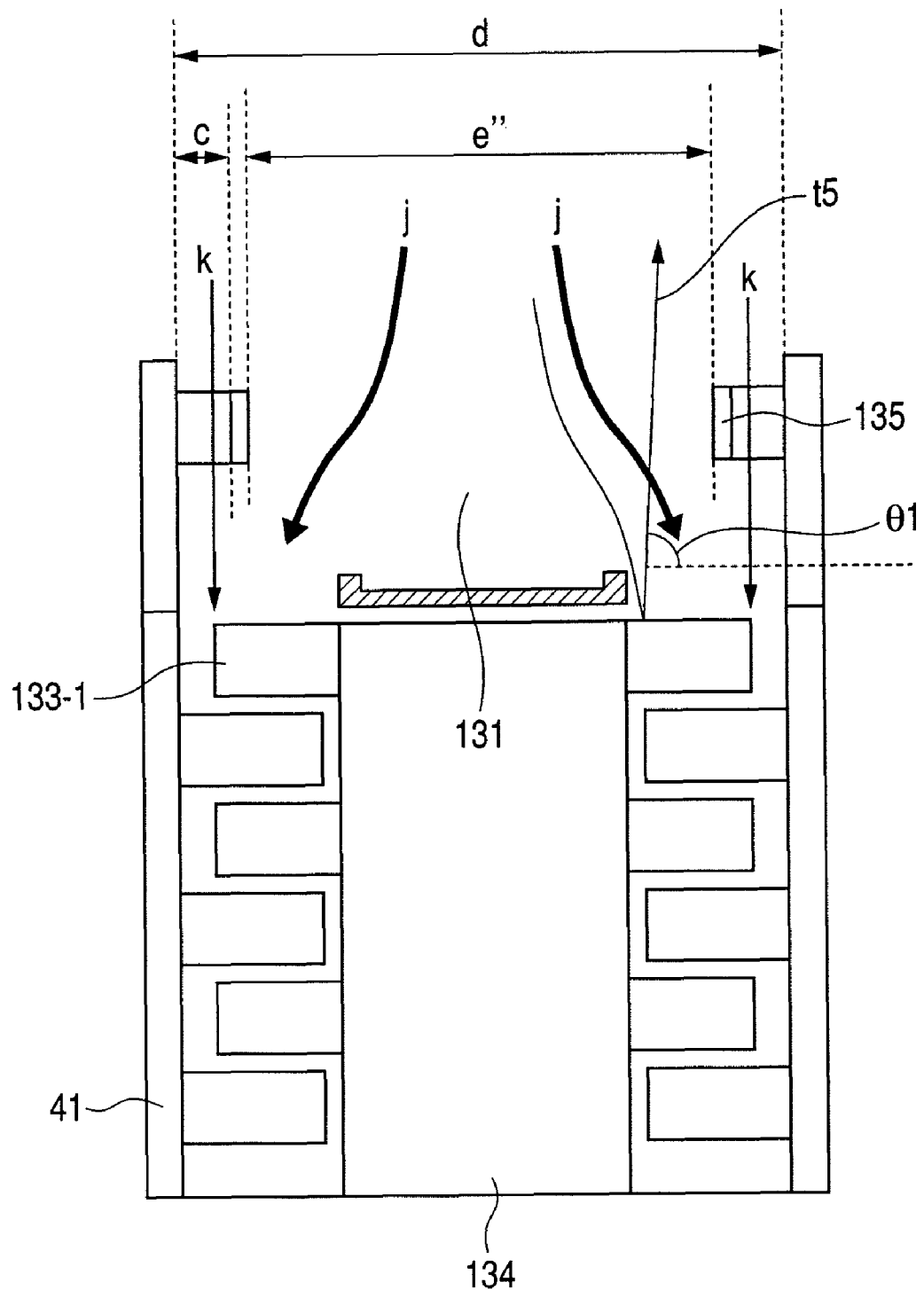
FIG. 3D is a view showing the function derived from a comparative example having the diameter e" of the center gas passage excessively larger than that of the present invention.

FIG. 3D shows another comparative example in which the diameter e" of the second exhaust route, that is, the center gas passage 131 is excessively large. The trace t5 of the particle in FIG. 3D shows that the particle is reflected by the blade 133-1 at the position near the rotary shaft 134 at the reflection angle (lift angle) θ1 close to 90°. As the trace t5 of the particle shows, if the diameter e" of the center gas passage 131 is excessively large, it is likely that the particle repelled by the rotary blade 133-1 passes through the particle dispersion prevention unit 89 to be dispersed into the vacuum processing chamber.

As the trace t2 of the particle in FIG. 4A shows, the risk of increase in the number of the particles reflected on the side wall to pass through the gas passage 131 and are dispersed into the vacuum processing chamber may become high. Referring to the trace t2 of the particle, the angle θ2 after passing through the particle dispersion prevention unit is far smaller than 90°. If the angle θ2 is small, unlike the case of the trace t5 at the large θ1, the particle is required to be reflected on the inner wall more frequently until it reaches the sample to be processed. In the aforementioned process, reflection on the wall or gas viscous force may sufficiently decelerate the particle. As a result, it is likely that the particle is pushed back to the exhaust side by the gas flow.

So it is important to reduce the number of particles which disperse to follow the trace t5 to be smaller than that of the particles which disperse to follow the trace t2.

It is therefore preferable to establish the relationship of $$e \leq g+f$$

where g denotes the radial length of the rotary blade 133-1, and f denotes the diameter of the rotary shaft of the rotary blade.

The relationship of $$e \leq f-g$$

may be established using the relationship of $$d \approx f+2 \times g$$

where d denotes the inner diameter of the turbo-molecular pump.

If the distance Hb is short, distribution of positions to which the particles reach in the radial direction at the height of the stationary blade 135 shows that more particles reach the outer circumference. Meanwhile, as the distance Hb increases, the radial distribution of the particles which reach the height of the stationary blade 135 becomes substantially uniform. It is preferable to establish the relationship of $$Hb \leq d$$

to suppress dispersion of the particle by the stationary blade 135 into the vacuum processing chamber.

In view of the exhaust conductance, it is preferable to reduce the radial thickness of the blade support ring 130 to substantially establish the relationship of $$d \approx e+2 \times c$$

where c denotes the radial length of the stationary blade 135 for the purpose of making the exhaust conductance values of the first and the second gas exhaust routes as large as possible.

Figure 4C:
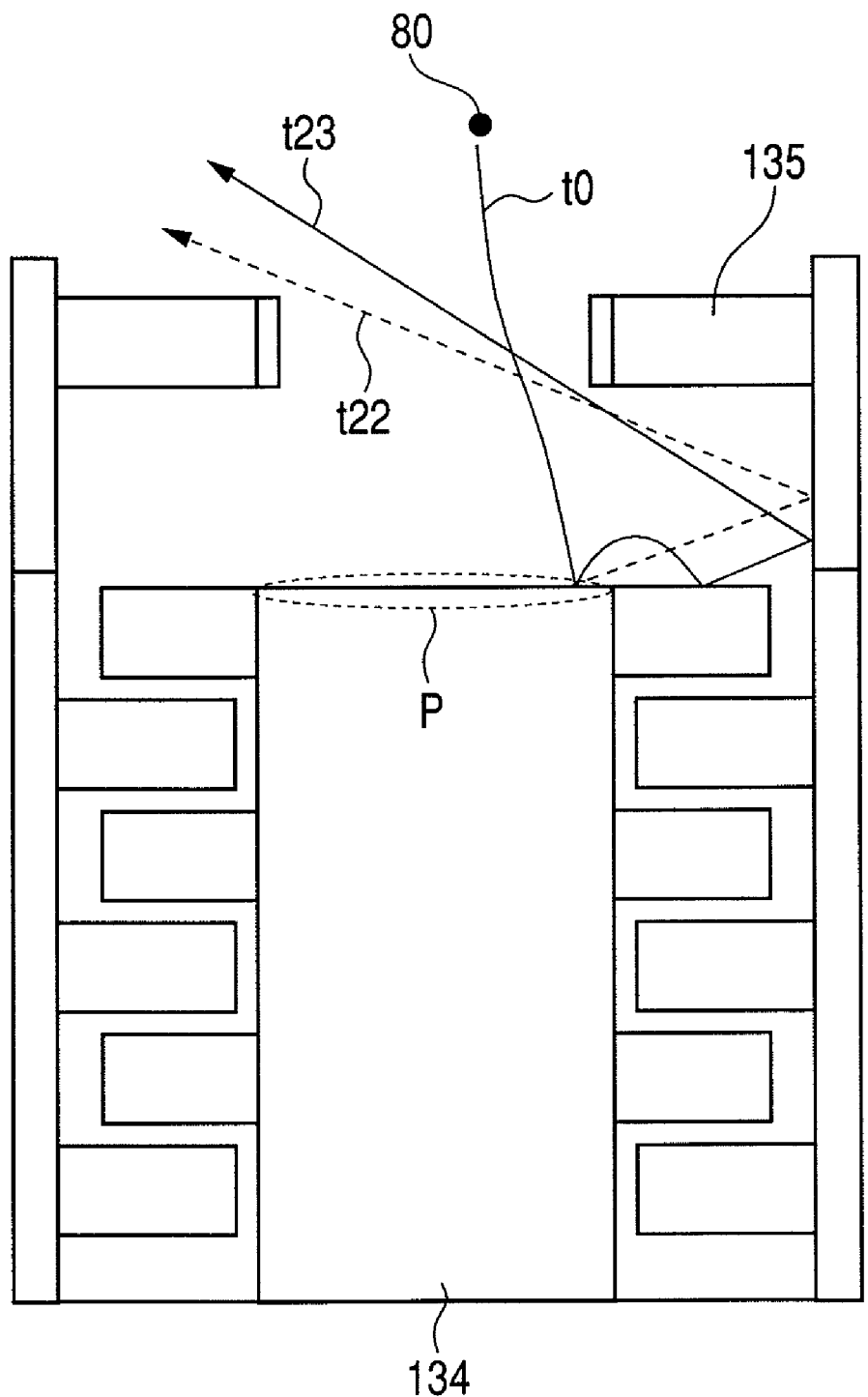
FIG. 4C shows a function derived from a comparative example without the particle drop prevention tray.

The particle drop prevention tray 136 disposed just above the rotary shaft 134 of the turbo-molecular pump will be described. If the upper surface P of the rotary shaft 134 of the turbo-molecular pump is exposed when seen from above, the incident particles through the center of the particle dispersion prevention plate partially reach the upper surface P of the rotary shaft. In this case, the particle is dispersed on the upper surface P of the rotary shaft, and may be dispersed into the vacuum processing chamber. This case is shown in FIG. 4C as the comparative example, which has no particle drop prevention tray 136. The codes t22 and t23 show examples of traces of the particles repelled on the upper surface P of the rotary shaft. The t22 represents the trace of the particle reflected at relatively high speed, and the t23 represents the trace of the particle reflected at relatively low speed. The trace t23 of the particle shows the state where the particle is reflected on the upper surface of the rotary shaft to the outer circumferential direction at the low speed, and repelled by the rotary blade at the high speed to be dispersed into the vacuum processing chamber. As the traces t22 and t23 of the particle show, it is not preferable to expose the upper surface P of the rotary shaft 134. As the trace t21 of the particle shows in FIG. 4A, the particle drop prevention tray 136 for receiving the particle is disposed just above the rotary shaft to prevent the particle from dropping onto the upper surface of the rotary shaft.

It is preferable to establish the relationship of $$h \approx f$$

where h denotes the diameter of the particle drop prevention tray 136. If h<g, the risk to cause the particle to reflect on the surface of the rotary shaft occurs. If h>g, the discharge of gas is hindered.

It is preferable to dispose the particle drop prevention tray to be adjacent to the upper surface of the rotary shaft as close as possible for the purpose of keeping the Ha sufficiently long while suppressing the height of the entire particle dispersion prevention unit. A bank W may be formed on the outer circumference such that the particle which has dropped onto the particle drop prevention tray does not fall into the turbo-molecular pump. Care has to be taken so as not to make the Ha value excessively small by the bank W.

Second Embodiment

A particle terminator disposed at the position corresponding to the height between the particle dispersion prevention unit and the turbo-molecular pump for trapping the particle will be described as a second embodiment of the present invention. Referring to FIG. 4A, the particle t31 partially disperses in the direction tangent to the rotation of the rotary blade by the rotary blade 133 of the turbo-molecular pump. Then the particle is repelled by the particle dispersion prevention unit downward to enter the turbo-molecules again. The particle which enters the turbo-molecular pump again at the high speed is likely to pass through the rotary blade 133. The particle which fails to pass through the rotary blade is repelled by the rotary blade again. That is, the particles partially reciprocate between the rotary blade of the turbo-molecular pump and the particle dispersion prevention unit. Finally, the particle passes between the blades of the particle dispersion prevention unit and the center gas passage 131 to be dispersed into the chamber. It is, thus preferable to provide the function for trapping the particle which reciprocates between the turbo-molecular pump and the particle dispersion prevention unit.

Figure 5A:
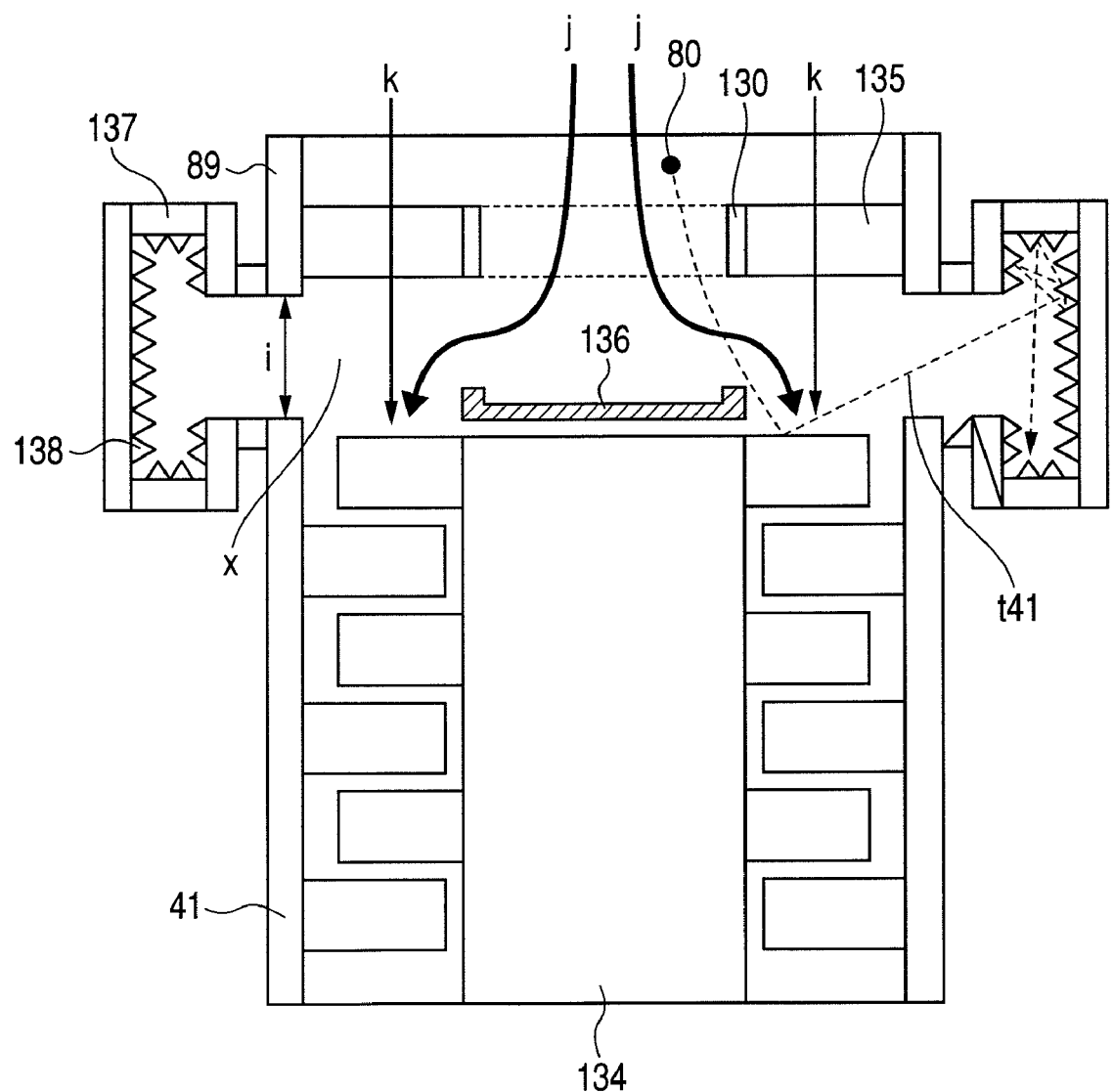
FIG. 5A is a longitudinal sectional view showing an enlarged portion in the area around a turbo-molecular pump and a particle dispersion prevention unit in a vacuum processing chamber according to a second embodiment.
Figure 5B:
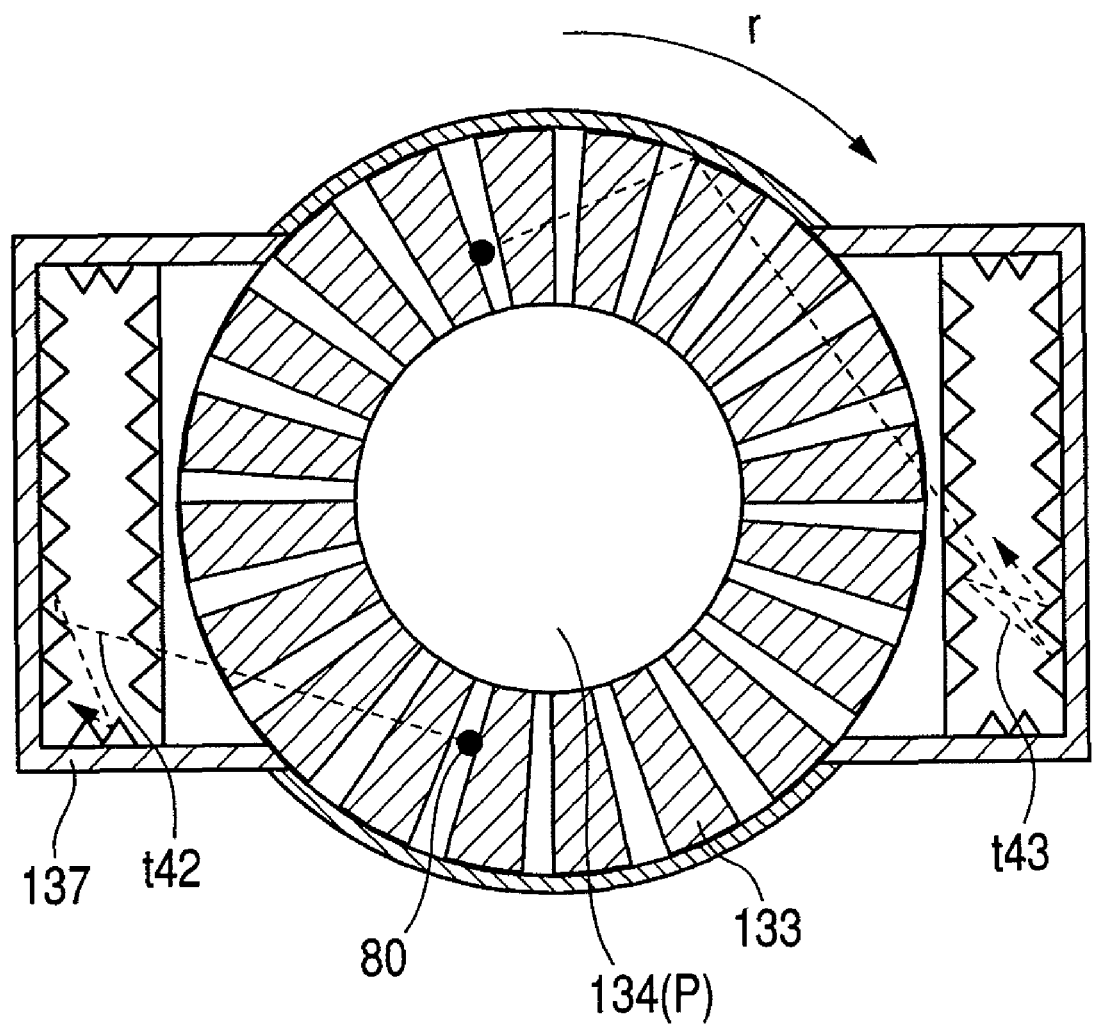
FIG. 5B is a transverse sectional view corresponding to FIG. 5A seen from above.

In the present invention, the particle terminator for trapping the particle is disposed on the side wall of the particle dispersion prevention unit as shown in FIGS. 5A and 5B. FIGS. 5A and 5B schematically show the particle terminator when seen from the side and above, respectively. Referring to FIGS. 5A and 5B, two particle terminators 137 are disposed at left and right sides in the embodiment. The particle terminator 137 includes the space for vertically trapping the particles as shown in FIG. 5A. Plural frog structures 138 (for example, similar to the structure provided with a large number of convex portions on the inner wall of the special room for insulating the reflected sound) are used such that the particle repelled by the turbo-molecular pump partially enters the particle terminator, and then dispersed into the space. As a result, the particle speed is gradually decelerated to be dropped and adhered inside the particle terminator (see traces t41 to t43 of the particle). The height position of the opening of the particle terminator is located between the stationary blade 135 and the rotary blade 133-1, which is substantially equal to that of the space x. Preferably, the length i of the opening in the height direction is set to be substantially the same as the distance Ha.

Third Embodiment

A third embodiment of the present invention will be described. If the rotating speed of the turbo-molecular pump is 24000 rpm, and the inner diameter d is 30 cm, the speed of the rotary blade in operation at the outermost circumference becomes approximately 300 m/s. Meanwhile, the initial speed of the particle repelled by the rotary blade of the turbo-molecular pump is about one tenth on an average, for example, 20 m/s. The turbo-molecular pump is structured to discharge gas particle/atom each in motion at several hundreds m/s. The incident particle at the speed corresponding to the flow rate of gas (several m/s) has the rotating speed too high to be easily discharged. If the particle is discharged, the rotating speed may be one tenth of that of the normal turbo-molecular pump or lower. When the stationary blade 135 of the particle dispersion prevention unit disposed above the turbo-molecular pump 41 as shown in FIG. 2B is rotated at 2000 rpm, the property for suppressing dispersion of the particle repelled by the turbo-molecular pump into the vacuum processing chamber while feeding the incident particle to the exhaust system to the turbo-molecular pump may be improved. The blade for the dispersion prevention is rotated to enlarge the gap between the adjacent blades, thus further suppressing reduction in the exhaust conductance.

What is claimed is:

1. A vacuum processing apparatus having a vacuum processing chamber, a gas supply unit for supplying processing gas to the vacuum processing chamber, and a turbo-molecular pump for reducing pressure of the vacuum processing chamber, wherein the vacuum processing apparatus comprising a particle dispersion prevention unit disposed between the turbo-molecular pump and the vacuum processing chamber,
    wherein the particle dispersion prevention unit includes a blade support ring, a plurality of blades provided on an outer circumference of the blade support ring, and an annular space formed downstream of the plural blades,
    wherein a tilting direction of the blade of the particle dispersion prevention unit is opposite a tilting direction of a rotary blade of the turbo-molecular pump, and a gap between the blades forms a first exhaust route,
    wherein the blade support ring includes a hole formed in a center, which forms a second exhaust route as a gas passage, and
    wherein the annular space transfers the gas passing through the second exhaust route in a radial direction so as to be mixed with the gas passing through the first exhaust route to form a third exhaust route for guiding the mixed gas to the rotary blade of the turbo-molecular pump.

2. The vacuum processing apparatus according to claim 1, wherein a relationship of $Ha \geq 0.2 \times g$ is satisfied; where Ha denotes a height of the annular space and g denotes a radial length of the rotary blade of the turbo-molecular pump.

3. The vacuum processing apparatus according to claim 1,
    wherein an inner diameter of the turbo-molecular pump is substantially equal to a diameter d of an inner wall of the particle dispersion prevention unit, and
    a relationship of $e \geq 0.25 \times d$ is satisfied; where e denotes a diameter of a hole formed in the center of the particle dispersion prevention unit.

4. The vacuum processing apparatus according to claim 1, further comprising a tray provided to face the annular space of the particle dispersion prevention unit above a rotary shaft of the turbo-molecular pump for preventing the particle from dropping onto an upper surface of the rotary shaft.

5. The vacuum processing apparatus according to claim 4, wherein a relationship of $Ha \geq 0.1 \times g$ is satisfied; where g denotes a radial length of the rotary blade of the turbo-molecular pump and Ha denotes a distance between a lower end of the blade of the particle dispersion prevention unit and the tray.

6. The vacuum processing apparatus according to claim 1, further comprising a particle terminator with a space for guiding the particle scattered by the turbo-molecular pump and a convex structure for deceleration by diffusely reflecting the particle in the particle terminator provided on an upper outer circumference of the turbo-molecular pump.

7. The vacuum processing apparatus according to claim 6, wherein the particle terminator is formed at a position outside the annual space in a radial direction.

8. A vacuum processing apparatus having a vacuum processing chamber, and a particle dispersion prevention unit disposed in a space between a pressure adjusting valve in an exhaust system of the vacuum processing chamber and a turbo-molecular pump,
    wherein the particle dispersion prevention unit includes a support ring with a hole formed in a center, a plurality of stationary blades which are tilted in a direction opposite a direction of a rotary blade of the turbo-molecular pump on an outer circumference of the ring member, and an annular space formed downstream of the plural stationary blades, and
    wherein the annular space forms a third exhaust route which transfers gas passing through a second exhaust route via the hole of the support ring in a radial direction so as to be mixed with the gas passing through a first exhaust route via a gap between the stationary blades for guiding the mixed gas into the rotary blade of the turbo-molecular pump.

9. The vacuum processing apparatus according to claim 8, wherein a relationship of $Hb \geq d$ is satisfied; where d denotes an inner diameter of the turbo-molecular pump, and Hb denotes a distance between a lower end of the blade of the particle dispersion prevention unit and an upper end of the rotary blade at an uppermost stage of the turbo-molecular pump.

10. The vacuum processing apparatus according to claim 9, wherein relationships of $e \geq g+f$ and $d \approx f+2 \times g$ are satisfied; where e denotes a diameter of the center hole, g denotes a radial length of the rotary blade, and f denotes a diameter of a rotary shaft of the rotary blade.

\* \* \* \* \*